United States Patent
Lo et al.

(10) Patent No.: US 8,259,870 B2
(45) Date of Patent: Sep. 4, 2012

(54) SYSTEM AND METHOD FOR DECODING A RECEIVED DATA SEQUENCE

(75) Inventors: Chiaming Lo, Irvine, CA (US); Ganning Yang, Irvine, CA (US); Yi Weng, Carlsbad, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 212 days.

(21) Appl. No.: 12/573,953

(22) Filed: Oct. 6, 2009

(65) Prior Publication Data
US 2010/0054375 A1   Mar. 4, 2010

Related U.S. Application Data

(62) Division of application No. 11/140,781, filed on May 31, 2005, now Pat. No. 7,616,713.

(51) Int. Cl.
H04L 27/06 (2006.01)
(52) U.S. Cl. ...................................................... 375/341
(58) Field of Classification Search .................. 375/316, 375/340, 341, 324, 325, 262, 263, 264, 265; 714/699, 746, 786, 792, 794, 795, 796; 708/100, 708/200, 270, 277
See application file for complete search history.

(56) References Cited

U.S. PATENT DOCUMENTS

| | | | |
|---|---|---|---|
| 6,563,877 B1 | 5/2003 | Abbaszadeh | |
| 6,829,313 B1 | 12/2004 | Xu | |
| 6,857,101 B1 | 2/2005 | Levy | |
| 6,868,518 B2 * | 3/2005 | Yuan et al. | 714/759 |
| 2002/0015457 A1 | 2/2002 | Obuchi et al. | |
| 2002/0029362 A1 | 3/2002 | Stephens et al. | |
| 2002/0061070 A1 | 5/2002 | Cameron et al. | |
| 2003/0123563 A1 * | 7/2003 | Lu | 375/265 |
| 2005/0031053 A1 * | 2/2005 | Claussen et al. | 375/340 |

FOREIGN PATENT DOCUMENTS

| | | |
|---|---|---|
| EP | 1 367 732 | 12/2003 |
| WO | WO2006130602 | 12/2006 |

OTHER PUBLICATIONS

Roberston et al, "A Comparison of Optimal and Sub-Optimal MAP Decoding Algorithms Operating in Log Domain", Proc. IEEE ICC '95, Seattle, USA, Jun. 1995, pp. 1009-1013.*
International Search Report received in connection with PCT Application No. PCT/US2006/020961 (WO2006130602), Mar. 25, 2011.
Extended European Search Report mailed Mar. 25, 2011, received in connection with European Patent Application No. 06771629.0.
Raouafi, et al., "Saving Memory in Turbo-Decoders Using the Max-Log-MAP Algorithm", IEE (Institution of Electrical Engineers, London, UK), Nov. 22, 1999, pp. 14/1-14/4, XP006502323.

(Continued)

*Primary Examiner* — David C. Payne
*Assistant Examiner* — Vineeta Panwalkar
(74) *Attorney, Agent, or Firm* — Knobbe, Martens, Olson and Bear LLP

(57) ABSTRACT

A system and method is provided for improved and efficient decoding of a received data sequence. The invention can perform the decoding using a LogMap function for a set of N inputs, where N is greater than 2.

7 Claims, 13 Drawing Sheets

OTHER PUBLICATIONS

Ohbuchi, K. et al., "Turbo Decoder for High-Speed Application in Wideband Code Division Multiple Access System", Proc. IEEE Global Telecommunications Conference Globecom 2003, San Francisco, CA, USA, Dec. 1-5, 2003; vol. 4, Dec. 1, 2003, pp. 2355-2359, XP010677776, DOI: DOI:10.1109/GLOCOM2003.1258656, ISBN: 978-0/7803-7974-9.

Schurgers, C. et al., "Energy Efficient Data Transfer and Storage Organization for a MAP Turbo Decoder Module", Proceedings 1999 International Symposium on Low Power Electronics and Design (ISLPED), San Diego, CA, USA, Aug. 16-17, 1999, pp. 76-81, XP010355952, DOI: DOI:10.1145/313817.313863, ISBN: 978-1-58113-133-8.

Hagenauer, J. et al. "Iterative Decoding of Binary Block and Convolutional Codes", IEEE Transactions on Information Theory, IEEE, US, vol. 42, No. 2, Mar. 1, 1996, XP011026493, ISSN: 0018-9448.

* cited by examiner $$G(D) = [\ 1\ (1+D+D^3)\,/\,(1+D^2+D^3)\ ]$$

SYSTEM AND METHOD FOR DECODING A RECEIVED DATA SEQUENCE

RELATED APPLICATIONS

This application is a divisional of U.S. patent application Ser. No. 11/140,781, filed May 31, 2005, which is related to U.S. patent application Ser. No. 11/140,703 filed May 31, 2005, now abandoned, titled "An Efficient Interleaver/De-Interleaver Design for the Turbo Decoder in a 3G WCDMA System," incorporated herein by reference.

FIELD OF THE INVENTION

This invention generally relates to wireless communications systems and more particularly to an improved method and architecture for forward and backward recursive computations, for example, as used with turbo code decoding.

BACKGROUND OF THE INVENTION

Iterative, or "turbo," coders are widely used in many communication systems including various 3G standards such as CDMA2000 and UMTS WCDMA. While turbo coders typically have impressive performance, particularly with regard to bit-error rate, they are complex and typically introduce a delay at the decoder.

One conventional turbo decoder uses a full block of data for its computations. This decoder stores all the forward computation results. In 3G WCDMA applications, assuming a maximum block length of approximately 5 kilobits (Kbits) and an 8-state turbo decoder, die random access memory (RAM) required to store the forward results is 5 Kbits*8, or 320 Kbits, plus an additional 145 Kbits of RAM for other functions and/or processes of the turbo decoder. This is not a practical implementation.

Another conventional turbo decoder uses only a portion of the full block of data for its computations. This so-called "sliding window" approach has been found to converge to the performance of the approach using the full block of data as the size of the window gets large. The RAM required to store the forward computations can be reduced to 4 Kbits plus the additional 145 Kbits for other functions and processes. The reduction in the amount of RAM required comes at the expense of performance.

What is needed is an improved system and method for forward and backward recursive computations that do not suffer from as great a performance degradation as the sliding window.

SUMMARY OF THE INVENTION

According to various embodiments of the invention, a turbo decoder uses both a full length approach and a sliding window approach to decode a received sequence. More particularly, the full length approach is used for the forward computations and the sliding window approach is used for the reverse computations.

In some embodiments of the invention, during the forward computations, all the bits in the received sequence are used. As would be appreciated, using all the bits provides the highest level of performance for the decoder. However, a significant amount of memory is required to store the results of these computations for the subsequent reverse computations. Thus, according to the invention, only the results of the forward computations corresponding to every $S^{th}$ bit in the received sequence are stored during the forward computations. Because of the nature of the forward computations, the results of the forward computations may be recomputed or recreated going forward from the results for any previous bit. Thus, the results of the forward computations for bits in between those results stored for a first $S^{th}$ bit and a second $S^{th}$ bit may be recovered.

In some embodiments of the invention, during the reverse computations, a sliding window approach is used. As would be appreciated, sliding windows require a smaller amount of memory as the expense of some performance. Rather than use the full length of the received sequence, sliding windows use a portion, subset, or sub-block of the received sequence. According to various embodiments of the invention, during the reverse computations, the results of the forward computations are recreated and stored for a portion of the received sequence sufficient to drive the sliding window. As discussed above, these results may be recreated or recovered using the stored results of the forward computations corresponding to one or more of the $S^{th}$ bits. These recreated results are subsequently used to drive the reverse computations of the sliding window. In these embodiments of the invention, only the intermediate results (in this case, the recreated intermediate results) corresponding to a portion of the received sequence are stored.

According to some embodiments of the invention, a reduced amount of memory is necessary over that required by conventional full-length decoders. More particularly, during the forward computations, memory is required to store the results of the forward computations only for every $S^{th}$ bit, and during the reverse computations, memory is required to store the recreated results of the forward computations for a portion of the bits in the received sequence (i.e., those bits encompassed by the sliding window).

According to some embodiments of the invention, an increase in performance is achieved over conventional sliding window decoders, in part, because the forward computations are used on the full length of the received sequence rather than just a portion of the received sequence.

Other objects and features of the invention will become apparent from the following detailed description considered in connection with the accompanying drawings that disclose embodiments of the invention. It should be understood, however, that the drawings are designed for purposes of illustration only and not as a definition of the limits of the invention.

DETAILED DESCRIPTION OF THE INVENTION

Figure 1:
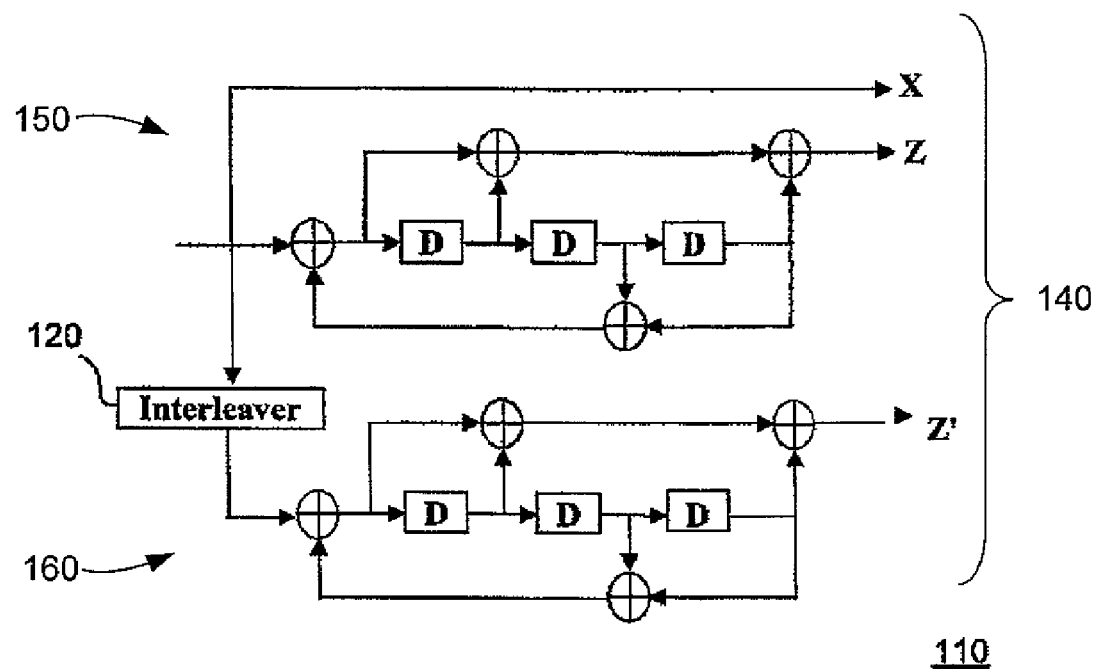
FIG. 1 illustrates a turbo encoder that may be used with various embodiments of the invention.

FIG. 1 illustrates an exemplary turbo encoder 110 according to one embodiment of the invention. In general, various types of turbo encoding schemes are used in wide bandwidth code-division multiple access ("WCDMA") communication systems such as third-generation ("3G") wireless communications. In some embodiments of the invention, a particular turbo encoder, such as a Parallel Concatenated Convolutional Code (PCCC) with two 8-state constituent encoders and one interleaver may be used. In some embodiments of the invention, the coding rate is ⅓.

Figure 2:
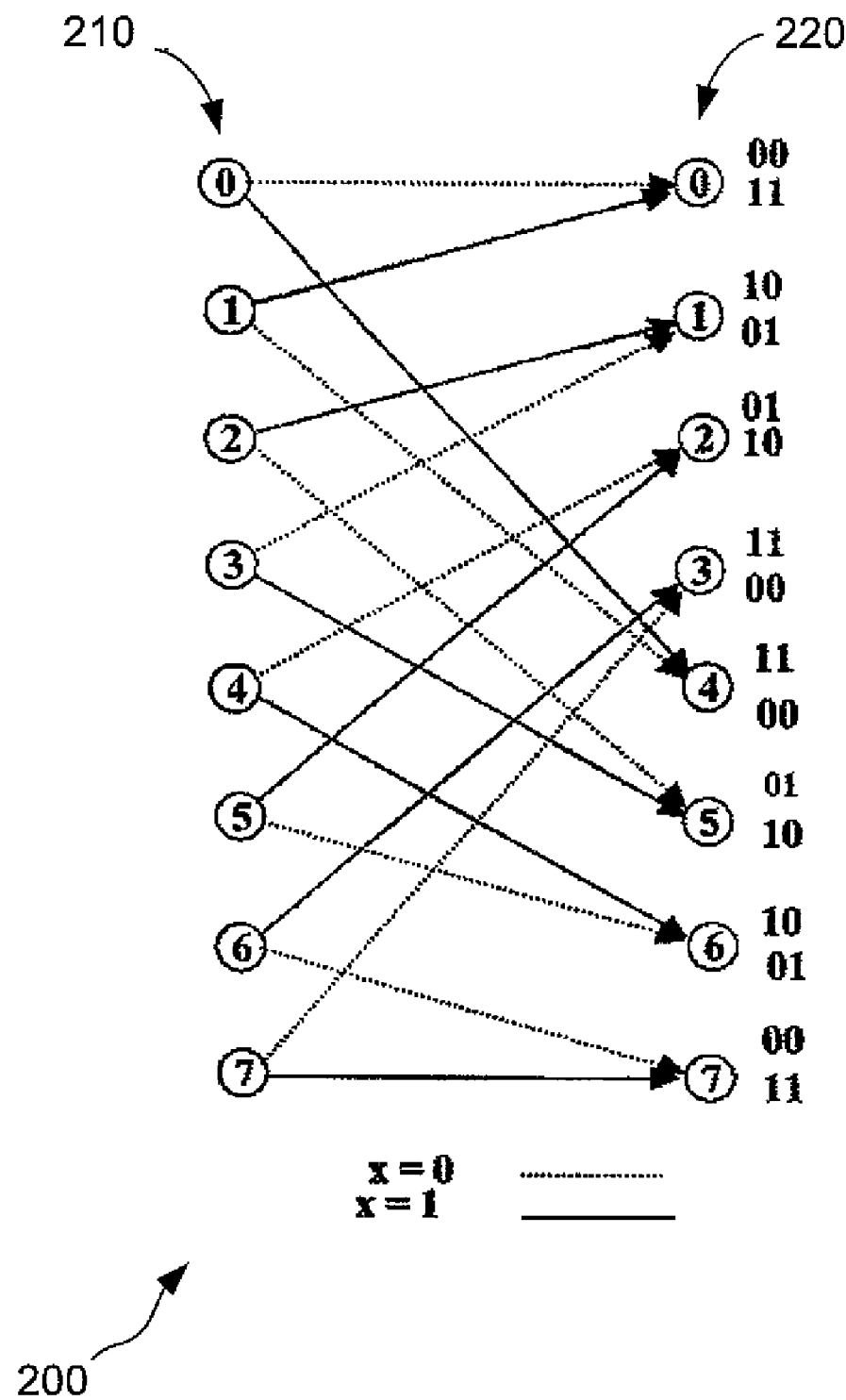
FIG. 2 illustrates a trellis diagram for the turbo encoder that may be used with various embodiments of the invention.

FIG. 2 illustrates a trellis diagram 200 for turbo encoder 110 according to one embodiment of the invention. Trellis diagram 200 illustrates state transitions between each of eight initial states 210 and eight next states 220 based on whether an input is '0' or '1'. Such trellis diagrams are generally well understood.

Bits X are input to an interleaver 120. These input bits are denoted as $x_1, x_2, \ldots,$ and $x_k$, where, in some embodiments of the invention, $5114 \geq k \geq 40$. With these input bits, an encoded output sequence 140 is generated by turbo encoder 110. Encoded output sequence 140 is denoted $x_1, z_1, z_1', x_2, z_2, z_2', \ldots, x_K, z_K, z_K'$.

Figure 3:
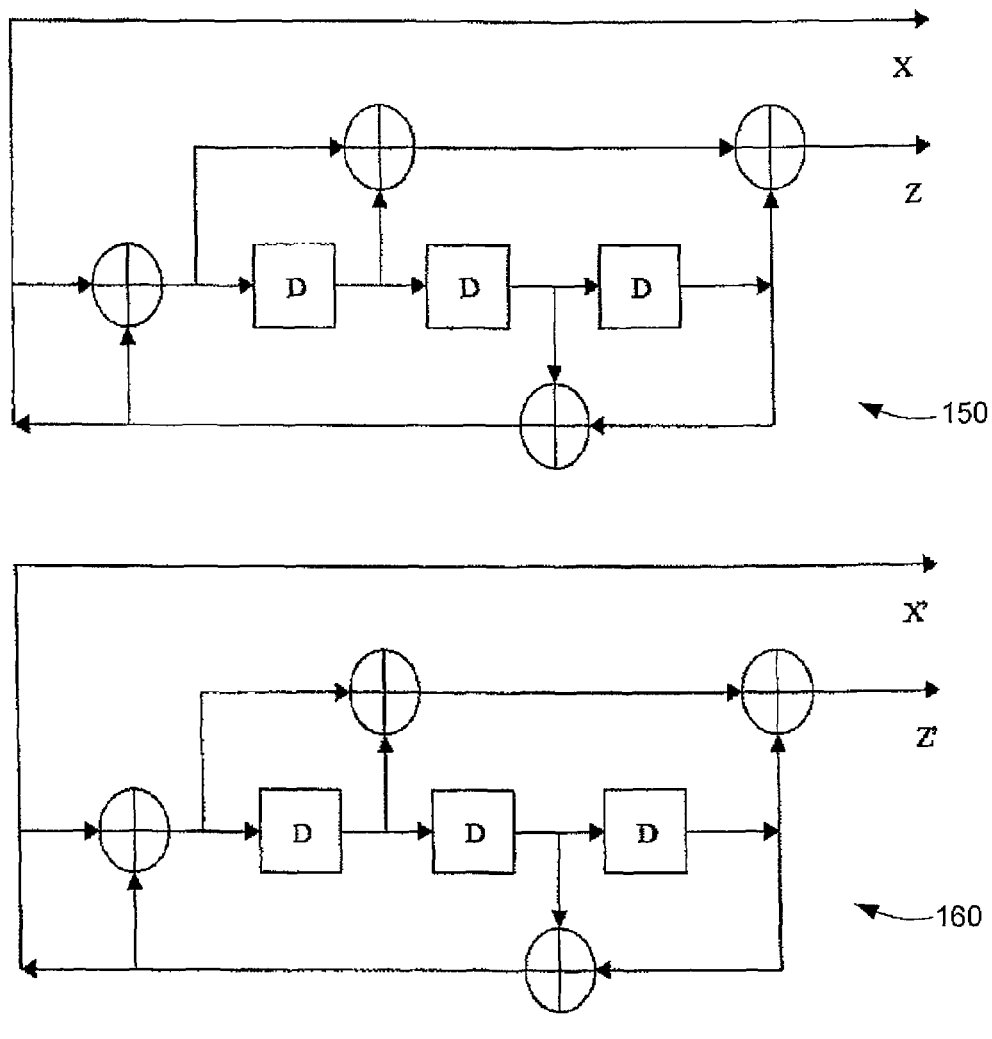
FIG. 3 illustrates a termination process for the turbo encoder that may be used with the present invention.

According to some embodiments of the invention, a termination process 300, such as that illustrated in FIG. 3 is used. During termination process 300, twelve termination or "tail" bits are padded onto the end of encoded output sequence 140. These tail bits are denoted $x_{k+1}, z_{k+1}, x_{k+2}, z_{k+2}, x_{k+3}, z_{k+3}, x_{k+1}', z_{k+1}', x_{k+2}', z_{k+2}', x_{k+3}',$ and $z_{k+3}'$. The first three tail bits, $x_{k+1}, x_{k+2}, x_{k+3}$, are used to clean an upper constituent encoder 150 while the last three tail bits, $x_{k+1}', x_{k+2}', x_{k+3}'$ are used to clean a lower constituent encoder 160. The tail bits do not go through interleaver 120 as would be apparent.

Before describing various components of a turbo decoder in accordance with the invention in further detail, various design considerations are now described. Conventional turbo decoders have been designed around three different, and often conflicting, design considerations: 1) algorithm performance, 2) cost in terms of die size, and 3) speed in terms of cycle counts per bit.

Various embodiments of the invention utilize different algorithms depending upon which design consideration is favored. For example, a so-called Map algorithm is generally considered to have the best performance; however, the Map algorithm is also the most expensive in terms of costs and complexity. While some embodiments of the invention may utilize the Map algorithm, other embodiments may utilize other known algorithms such as a so-called Max2 algorithm. The performance of the Max2 algorithm approaches that of the Map algorithm with the benefit of reduced complexity and cost. Even though the invention is described herein as employing the Max2 algorithm, other types of algorithms may be used as would be appreciated from reading this description.

In terms of costs, including, for example, die size, three aspects of conventional turbo decoders tend to consume the most significant portions of die area. These aspects are 1) storage for the input data arrays (i.e., M, Y) and the intermediate data arrays between the forward and backward architectures (i.e., M', and Y'); 2) generating of internal interleaver addresses; and 3) storage for the intermediate probability data (i.e., L). As will be described below, various embodiments of the invention attempt to reduce the size of one or more of these storage aspects.

In terms of speed, assuming a 3G WCDMA system with clock rate of 3.84 MHz, 8 states, and a maximum data rate of 2 Mb, there is a maximal cycle count of about 15 cycles/bit imposed on the design of any turbo decoder. As is generally known, turbo decoder operation is serial in nature and better performance is achieved based on one or more recursions or iterations performed. Three iterations correspond to six times through the decoder calculations (i.e., forward and backward). This corresponds to an operating speed of roughly 2.5 cycles per bit.

In some embodiments of the invention, the die size may be reduced by reducing the memory size. In some embodiments, this may be accomplished be reducing a size of the data arrays. In some embodiments of the invention, while a number of data elements in the data arrays is fixed at for example, 5 k data elements, a number of bits used to represent each data element may be adjusted. In some embodiments of the invention, each data element in the input data arrays is quantized using 4 bits. In some embodiments of the invention, each data element in the intermediate data arrays is quantized using 4 bits. In some embodiments of the invention, each data element in the soft output array is represented as 6 bits which is sufficient to maintain performance similar to 7 or more bits. Other numbers of bits for any of these data arrays may be used as would be apparent.

In some embodiments of the invention, the memory size may also be reduced by implementing an interleaver in the decoder in hardware rather than via a direct memory map. In other embodiments of the invention, the interleaver may require storage for 5 k×13=65 k bits. While implementing the interleaver in hardware may save significant memory, the overall complexity of the turbo decoder may increase.

Another mechanism for reducing the memory size uses a so-called sliding window method proposed by A. J. Viterbi as described in, for example, U.S. Pat. No. 5,442,627, entitled "Noncoherent Receiver Employing a Dual-Maxima Metric Generation Process," which issued on Aug. 15, 1995. In general, turbo decoders compute a probability for at each bit in a data block in a recursive manner. Because each bit is dependent upon its previous bits as well as on its next bits in the data block, some turbo decoders require significant memory for storing intermediate decoder results. For example, assuming 5 k data elements in the data block, 8 states and 8 bits of resolution, 320 Kbits are required to store these intermediate decoder results. Viterbi discovered mat bit dependency decayed after a certain number of bits (e.g., 64) and therefore decoding could be implemented on a subset of the data block, for example, on a sub-block by sub-block manner with each sub-block including, for example, 128 bits and overlapping the next sub-block by half the length (e.g., 64). This "sliding window" reduces the amount of memory used to store intermediate results, in this example, from 320 Kbits to 8.192 Kbits.

The sliding window method, however, suffers from some minor performance loss. As a result, the sliding window is typically selected when the data block is very large or unterminated. However, for blocks of fixed maximal length and with repeated operations, computing the probabilities using the full length of the data block may be more appropriate and suffers no performance loss.

According to the invention, a combination of both the full length approach and the sliding window approach is used. In particular, during the forward operations, the full length approach is used, whereas during the backward operations, the sliding window approach is used.

According to the invention, die data block is broken into a number K of sub-blocks, each having a number S of data elements (i.e., bits in the sequence to be decoded); except that in some embodiments of the invention, one of the blocks (e.g., the last block, the first block, etc.) may have fewer than S bits. During the forward operations, only the intermediate results corresponding to the last bit in each sub-block (which are also the initial values for the computations for the next sub-block) are stored and the remaining intermediate results are discarded. As would be appreciated from this description, the forward operations can be repeated for any sub-block (and those thereafter) by using die stored intermediate results of the last bit in the previous sub-block to thereby recreate the intermediate results for that one sub-block.

Because the forward operations can be used to recreate the intermediate results, they need not be stored as with conventional full-length turbo decoders. According to the invention, during the backward operations, the forward operations are repeated using a sliding window approach on a sub-block by sub-block basis and using the corresponding stored intermediate result for each sub-block. The repeated or recreated intermediate results for the sub-block are stored for use by the backward operations, and then, only for one sub-block at any given time, thereby significantly reducing the memory required. The stored recreated results of the forward operations are used for the backward operations and the determination of the final soft output values. In some embodiments of the invention, these operations are performed on the last sub-block first and continued on a sub-block by sub-block basis backward to the first sub-block. Although the forward operations are performed twice with respect to each bit in the data block, the invention is no more complex man the sliding window approach while requiring substantially less memory to store the intermediate results.

Figure 4:
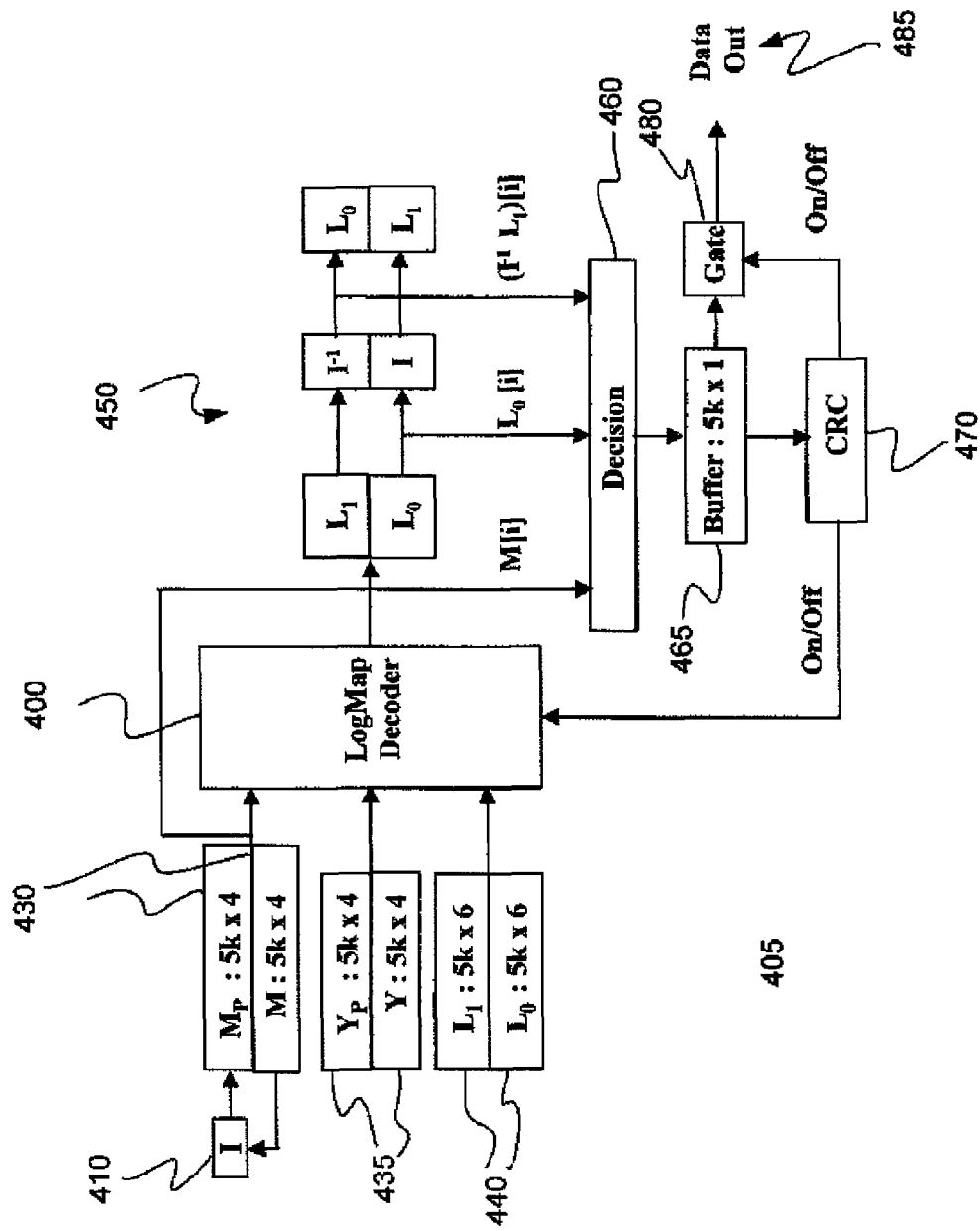
FIG. 4 illustrates a decoding system according to one or more embodiments of the invention.
Figure 5:
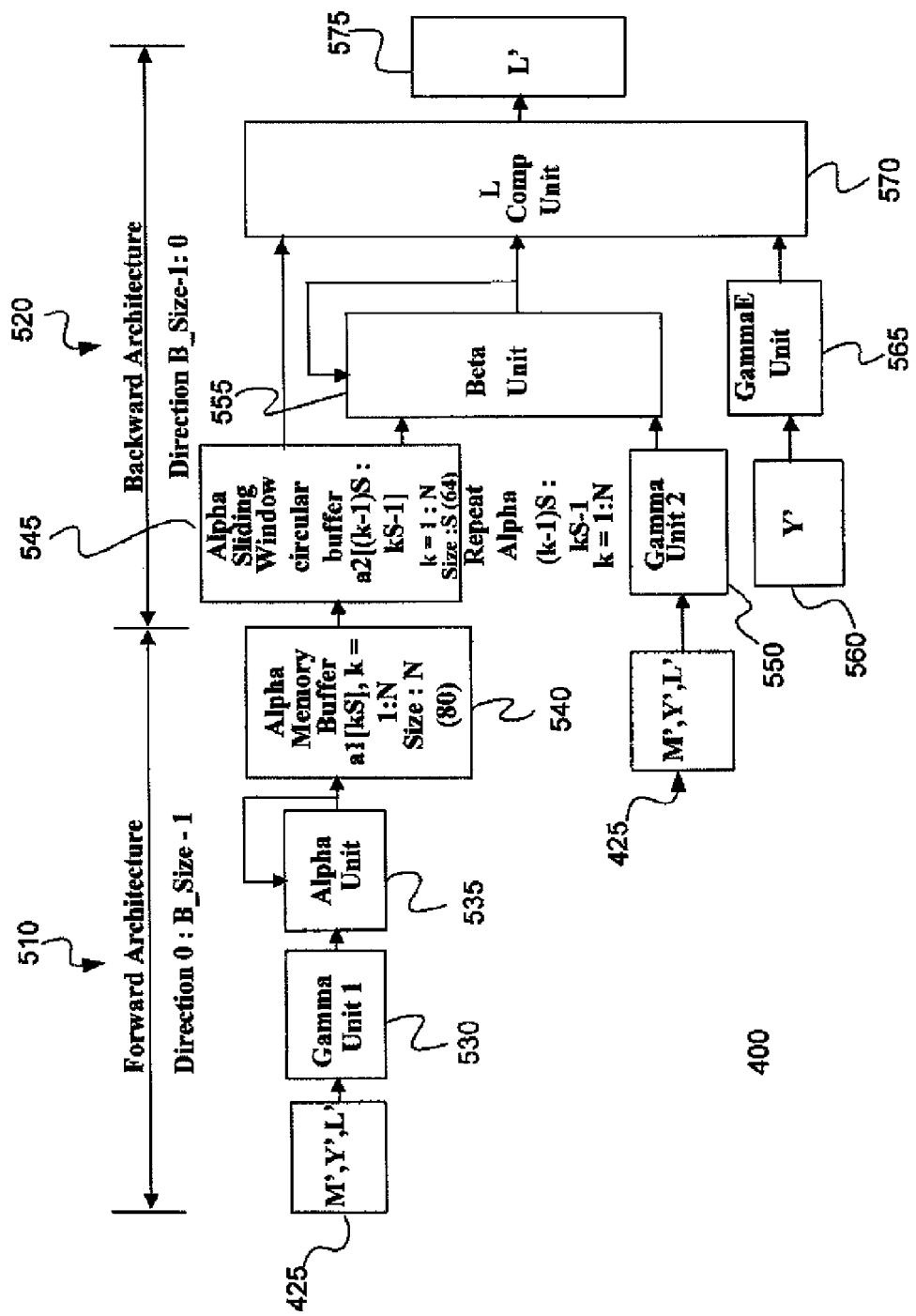
FIG. 5 illustrates an architecture for a turbo decoder in accordance with one or more embodiments of the invention.

A turbo decoder 400 in accordance with the invention is now described with reference to FIG. 4 and FIG. 5. FIG. 4 illustrates a decoding system 405 in which turbo decoder 400 may be used according to one or more embodiments of the invention. FIG. 5 illustrates an architecture of turbo decoder 400 in accordance with one or more embodiments of the invention. Turbo code decoding theory and algorithms, which are generally well known, are not further described herein.

System 405 includes memory arrays 430, 435, 440, an interleaver 410, turbo decoder 400, intermediate results 450, a decision block 460, a data buffer 465, a CRC check unit 470, and an output gate 480.

Memory arrays 430, 435 and 440 are used to store data values for M, Y, and L, respectively and feed turbo decoder 400. As illustrated, memory array 430 includes data arrays for $M_p$ and M. In some embodiments of the invention, each of these data arrays are roughly 5K data elements (more precisely 5114 data elements), where each data element includes 4 bits. As illustrated, memory array 435 includes data arrays for $Y_p$ and Y. In some embodiments of the invention, each of these data arrays are also roughly 5K data elements, where each data element also includes 4 bits. As illustrated, memory array 440 includes data arrays for $L_1$ and $L_0$ (i.e., the soft output arrays) In some embodiments of the invention, each of these data arrays are roughly 5K data elements, where each data element includes 6 bits.

The function and operation of interleaver 410 is generally well known. In some embodiments of the invention, interleaver 410 is implemented as a direct memory map requiring data arrays of 5K data elements by 13 bits (in total). In some embodiments of the invention, interleaver 410 is implemented in hardware. In some embodiments of the invention, interleaver 410 is implemented in a combination of memory map and hardware. Interleaver 410 may include an interleaver as disclosed in the related patent application titled "An Efficient Interleaver/De-Interleaver Design for the Turbo Decoder in a 3G WCDMA System, U.S. patent application Ser. No. 11/140,703, filed May 31, 2005, now abandoned, which is incorporated herein by reference in its entirety.

Turbo decoder 400 receives the data elements from memory arrays 430, 435, and 440 and outputs intermediate results 450. Intermediate results 450 are fed to a decision block 460 for determination of an estimate for an decoded output sequence 485. The estimate is stored in buffer 465. A CRC checking unit 470 determines the integrity of the estimate for the decoded output sequence. In some embodiments of the invention, CRC checking unit 470 may control a number of iterations performed by turbo decoder 400 based on the integrity of the estimate. Once a sufficient level of integrity is reached, CRC checking unit 470 controls gate 480 to output the estimate as decoded output sequence 485.

Turbo decoder 400 is now described with reference to FIG. 5. According to the invention, turbo decoder 400 includes a forward architecture 510 and a backward architecture 520 to decode input sequence 425. Forward architecture 510 includes input sequence 425, a first gamma unit 530, an alpha unit 535, and an alpha memory buffer 540. Backward architecture 520 includes an alpha sliding window buffer 545, a second gamma unit 550, a beta unit 555, a gamma E unit 565, an L unit 570, and an output stream 575.

Turbo encoder 400 includes three primary parts: alpha unit 535, beta unit 555, and L unit 570. The various equations used for the calculations performed by each of these units are generally well know. Implementations of these three units are now described according to one or more embodiments of the invention.

Alpha unit 535 implements the forward operations to determine alpha. Alpha unit 535 receives values for gamma from first gamma unit 530 which determines them from the memory arrays 430, 435, and 440. These determinations are generally well known. According to various embodiments of the invention, every $S^{th}$ alpha (i.e., the value of alpha corresponding to the last bit in each sub-block) is stored in alpha memory buffer 540.

During the backward operations, alpha unit 535 is also used to recreate alpha for on a sub-block basis, based on values previously stored in alpha memory buffer 540. In some embodiments of the invention, the recreated values of alpha are stored in alpha sliding window buffer 545 for use with the backward operations described below. While illustrated in FIG. 5 as a circular buffer, other memory configurations may be used as would be apparent.

In some embodiments of the invention, alpha sliding memory buffer 545 is sized in accordance with the size of the sliding window. As illustrated, according to various embodiments of the invention, alpha sliding memory buffer 545 is sized to accommodate intermediate results for 64 bits of the received sequence. Other sizes for sliding windows, such as, but not limited to, 16, 32, 128, 256, and other sizes, may be used as would be apparent.

Figure 7:
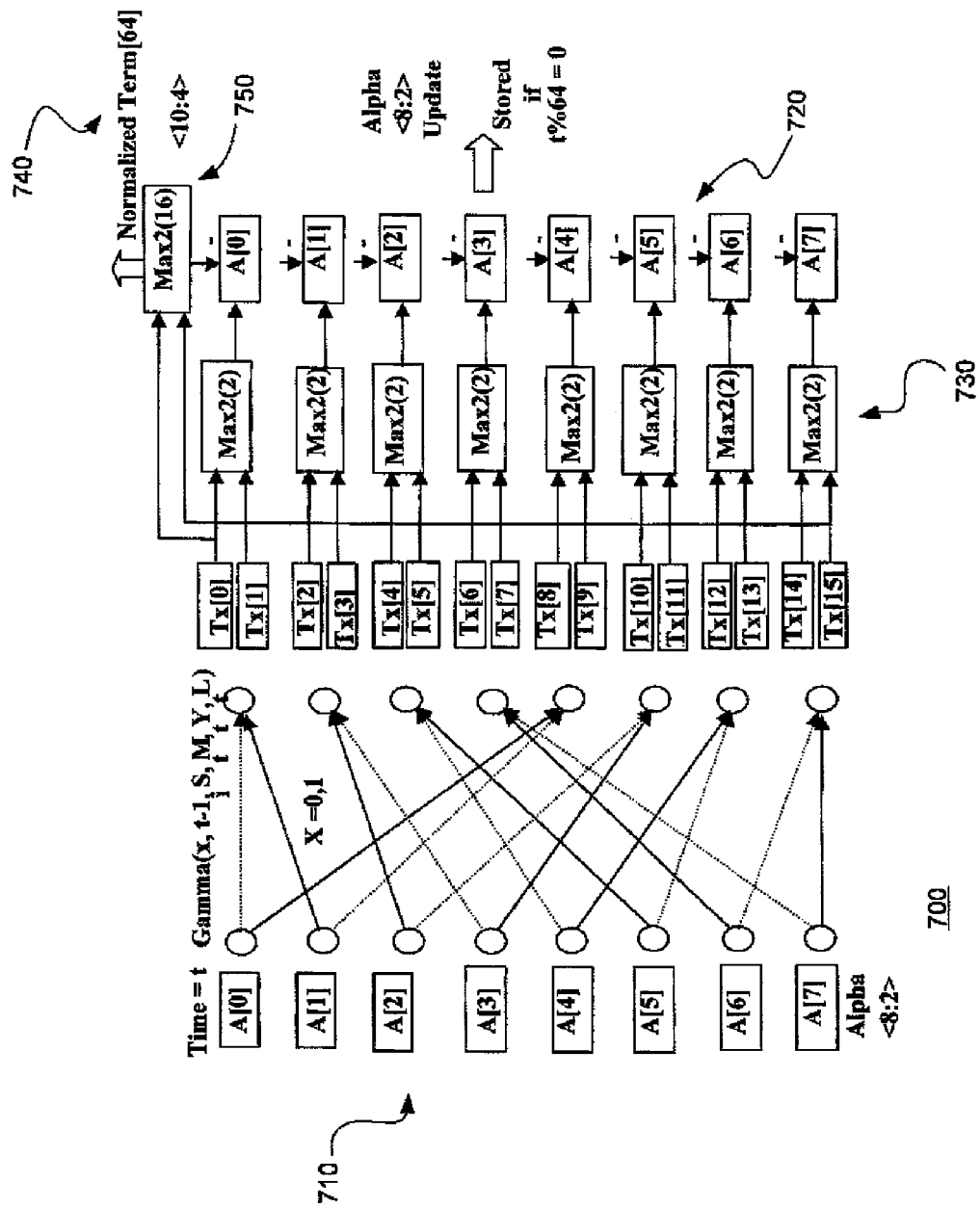
FIG. 7 illustrates the processing of an alpha unit in accordance with one or more embodiments of the invention.

Alpha unit 535 may be implemented in accordance with a state transition diagram 700 as illustrated in FIG. 7. As illustrated, alpha unit 535 uses old or prior values of alpha 710 for each of the eight states and the corresponding gamma values from first gamma unit 530 to determine new or updated values for alpha 720 for each of the eight states. The gamma values are used with prior values of alpha 710 to generate eight pairs of values (illustrated as $T_x$) which are provided to a Max2 function block 730. Max2 function block 730 performs the so-called Max2 algorithm on each of the eight pairs of values $T_x$ to generate updated values of alpha 720. Other algorithms may be used as would be apparent. The operation of function block 730 is described in further detail below.

Beta unit 555 implements the backward operations to determine beta. Beta unit 555 receives values for gamma from second gamma unit 550 which determines them from the memory arrays 430, 435, and 440. These determinations are generally well known. Beta unit 555 also receives values far alpha from alpha sliding window buffer 545.

Figure 8:
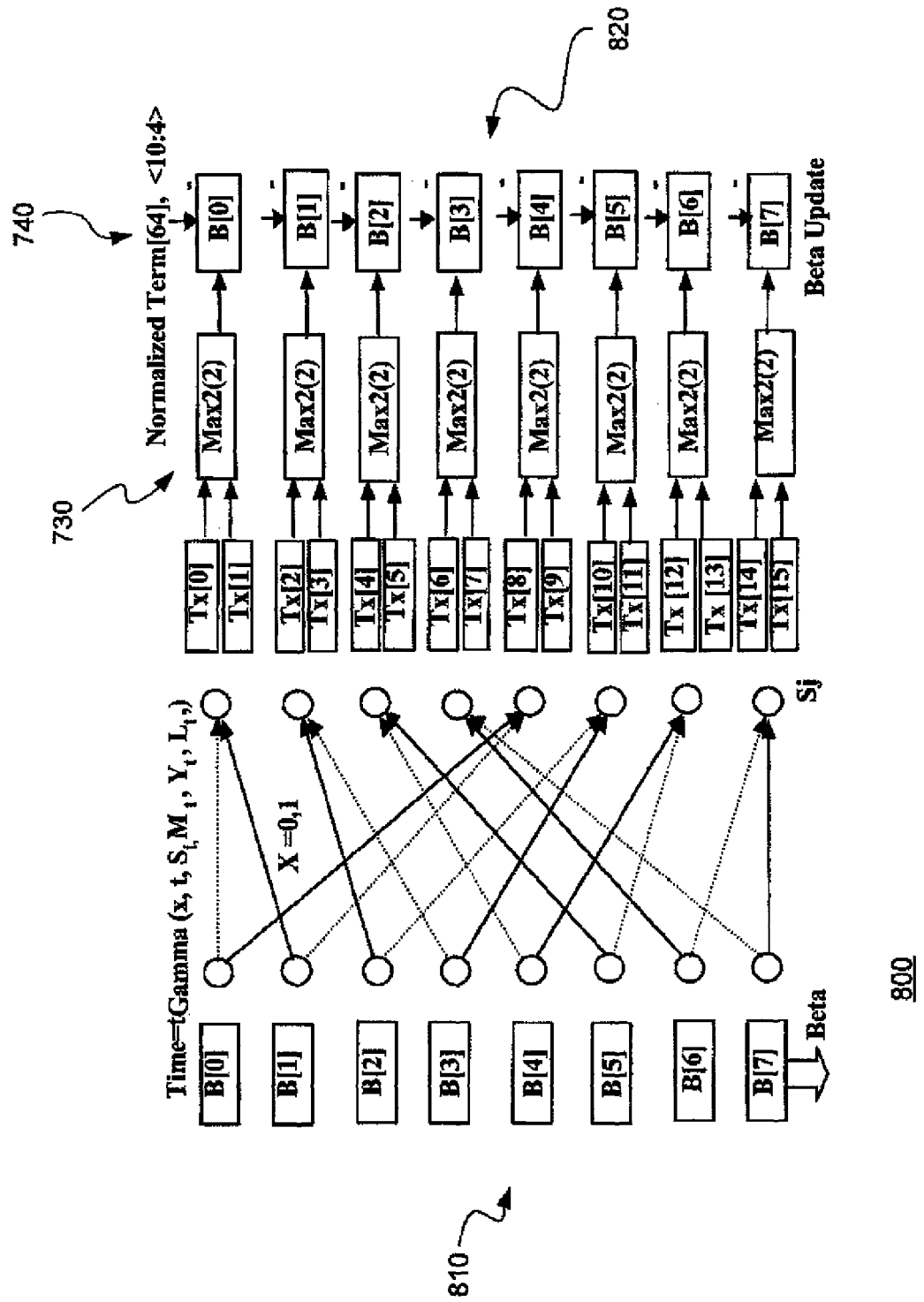
FIG. 8 illustrates the processing of a beta unit in accordance with one or more embodiments of the invention.

Beta unit 555 may be implemented in accordance with a state transition diagram 800 as illustrated in FIG. 8. As illustrated, beta unit 555 uses old or prior values of beta 810 for each of the eight states, the corresponding gamma values from second gamma unit 550, and alpha values from alpha sliding window buffer 545 to determine new or updated values for beta 820 for each of the eight states. The gamma values are used with prior values of beta 810 to generate eight pairs of values (illustrated as $T_x$) which are provided to a Max2 function block 730. Max2 function block 730 performs its operations on each of the eight pairs of values $T_x$ to generate updated values of beta 820.

L unit 570 uses outputs from alpha sliding window buffer 545 and beta unit 555 to determine a difference in probability between an outcome '1' and '0' for each bit to be used as soft output for subsequent processing. L unit 570 receives values for gammaE from gammaE unit 565 which determines them from the memory arrays 435. These determinations are generally well known.

Figure 9:
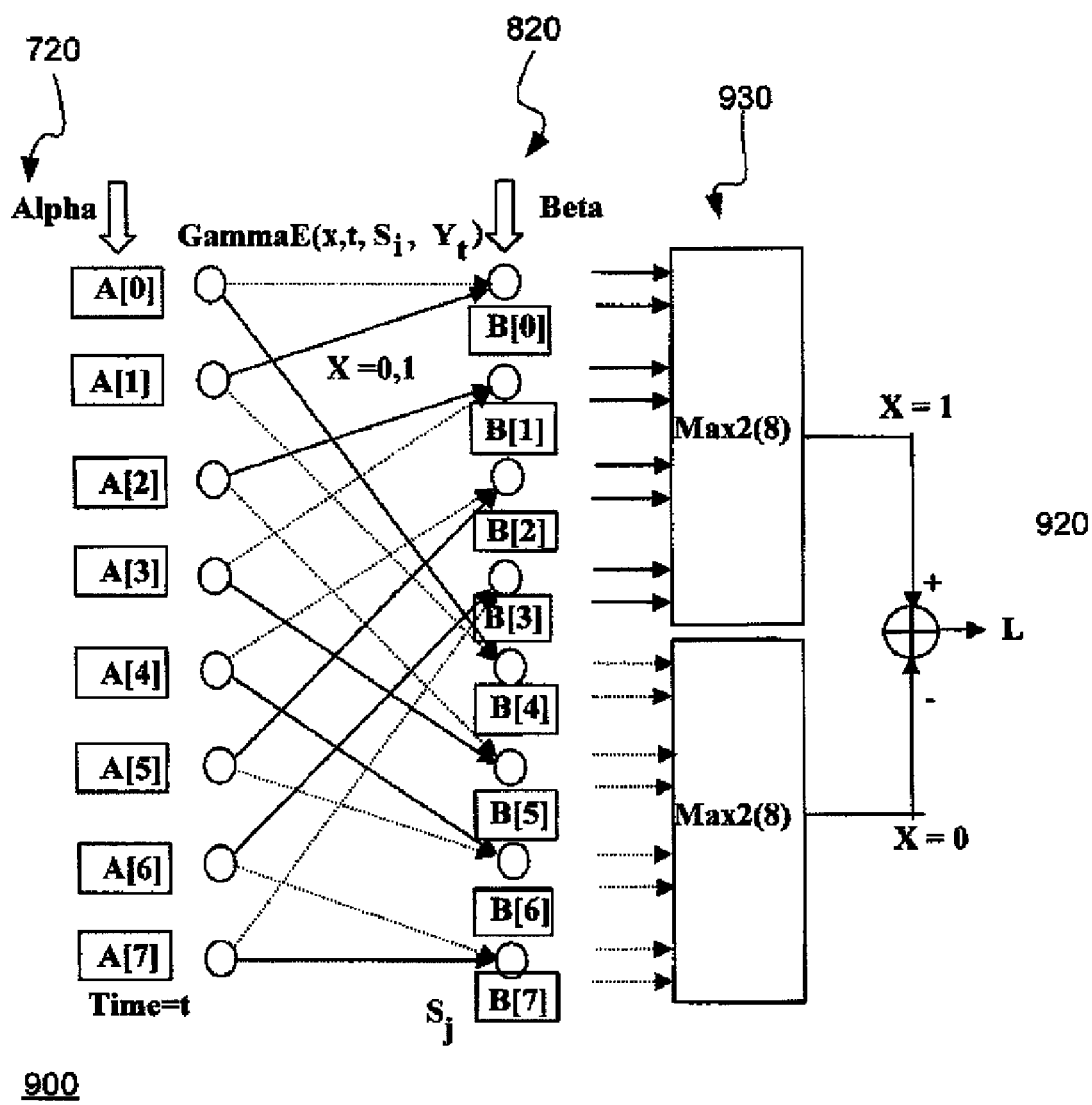
FIG. 9 illustrates the processing of an L-unit in accordance with one or more embodiments of the invention.

L unit 570 may be implemented in accordance with a state transition diagram 900 as illustrated in FIG. 9. As illustrated, L unit 570 uses updated values of alpha 720 for each of the eight states and updated values of beta 820 for each of the eight states and the corresponding gammaE values from gammaE unit 565 to determine new or updated soft values for L 920. In some embodiments of the invention, the first four pairs of values are fed into a Max2 function block 930 and the second four pairs of values are fed into a second (or subsequent iteration of) Max2 function block 930 to generate two values, the difference between which is used as the soft value. The operation of function block 930 is described in further detail below.

In some embodiments of the invention, alpha 720 and beta 820 are normalized at each point. In some embodiments of the invention, a Max2 function block 750 is used to determine a normalization value 740. As this normalization process is computationally intensive, after normalization value 740 is determined for alpha, the normalization value 740 is stored for each bit in the sub-block for use in normalizing beta as illustrated in FIG. 8.

Figure 6:
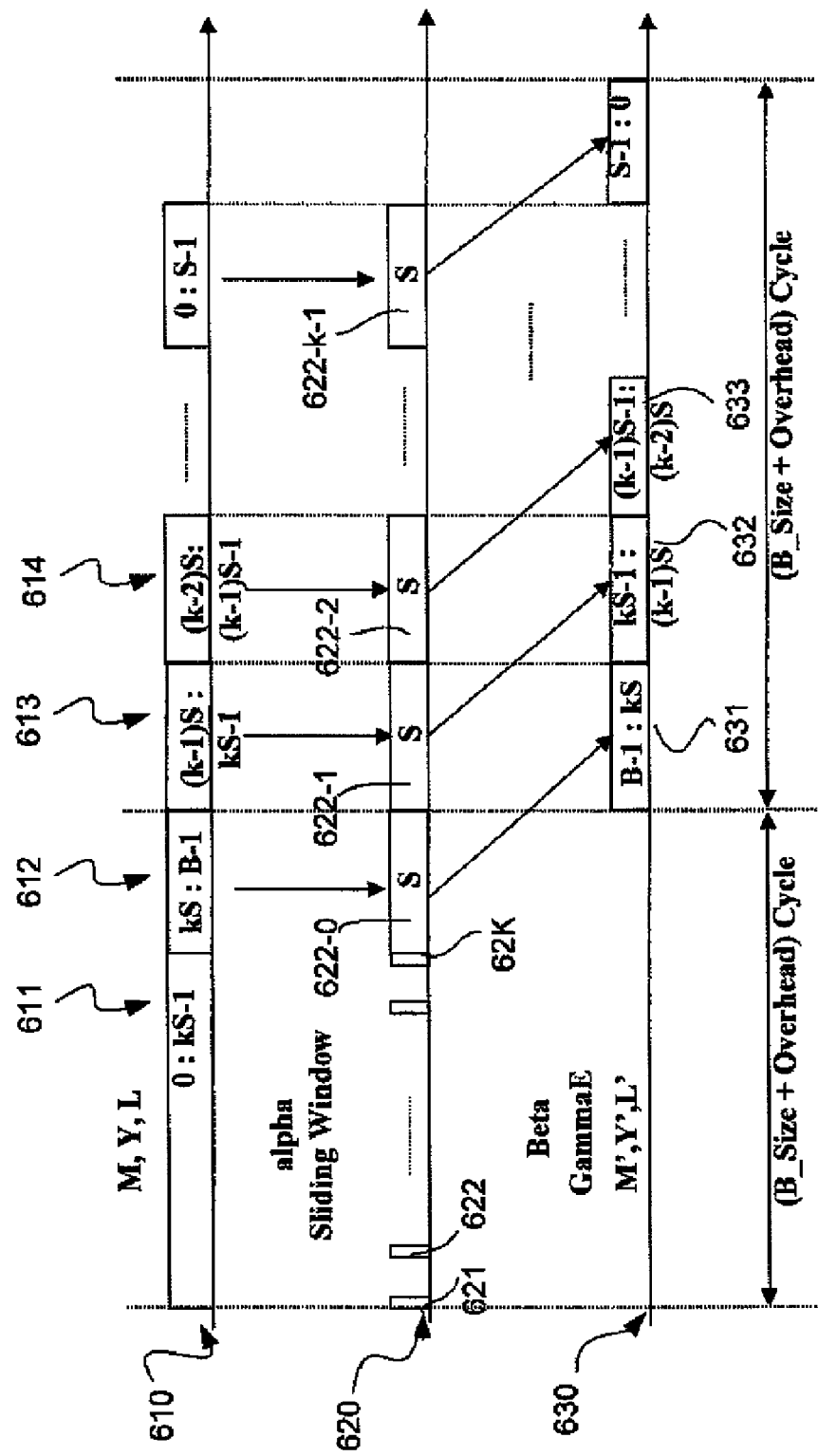
FIG. 6 is a timing diagram that illustrates an operation of a sliding window for forward and backward operations of a turbo decoder in accordance with one or more embodiments of the invention.

FIG. 6 illustrates the operation of turbo decoder 400 in accordance with one or more embodiments of the invention in further detail. Timeline 610 illustrates the data operated upon by the forward operations. Timeline 620 illustrates the data stored as a result of the forward operations. Timeline 630 illustrates the data operated upon by the backward operations. More particularly, during a forward operation interval 611, the forward operations operate over the entire data block, which in some embodiments of the invention, includes 5114 data elements as discussed above. In some embodiments of the invention, this may be accomplished on a sub-block by sub-block basis as would be appreciated. During forward operation interval 611 and at the end of each sub-block, the results of the forward operations are stored as illustrated by storage intervals 621, 622, . . . 62K. As discussed above, these stored forward results are used as the initial values for the next sub-block and hence may also be referred to as the values at the beginning of each sub-block.

During a forward operation interval 612, the forward operations are repeated on the last sub-block using the last stored forward results 62K as an initial value. During interval 612, all the results from the forward operations using this last sub-block are stored as illustrated by storage interval 622-0. These results 622-0 are operated upon by the backward operations during a backward operation interval 631 to determine the soft output values. Likewise, during an interval 613, all the results from the forward operations on the next to last sub-block using the next to last stored forward results 62K-1 as an initial value. These results, which are illustrated by storage interval 622-1, are operated upon by the backward operations during a backward operation interval 632 to determine the soft output values. This process is repeated until all sub-blocks have been processed.

Various block and sub-block sizes may be used as would be apparent. In some embodiments of the invention, a block having a fixed length of 5114 data elements is broken into 80 sub-blocks of 64 data elements each, with the exception of the last block which has 58 data elements. In some embodiments of the invention, the number of sub-blocks (K) and the number of data elements per sub-block (S) are dependent on the number of data-elements in the block (B) and may be selected to satisfy: 1) S is a power of 2, 2) K×S>B, and 3) the value of K+S is minimized. In these embodiments of the invention, storage is required for K stored forward results 621, 622, . . . 62K, each with 8 states, and also for the forward results of one of the sub-blocks at any given time.

As illustrated in FIGS. 7, 8 and 9, according to one or more embodiments of the invention, each of alpha unit 535, beta unit 555, and L unit 570 utilizes various forms of a Max2 function block, namely Max2 function block 730, Max2 function block 750, and Max2 function block 930. In some embodiments of the invention, different function blocks may be used to accommodate different numbers of inputs, e.g., 2, 8, 16, or other numbers of inputs. In other embodiments of the invention, one function block may be used to accommodate various numbers of inputs. In addition, other embodiments may use different algorithms as would be apparent. For example, a Map algorithm may be used in place of Max2, or a LogMap may be used in place of Max2. Other algorithms may be used as would be apparent.

Figure 10:
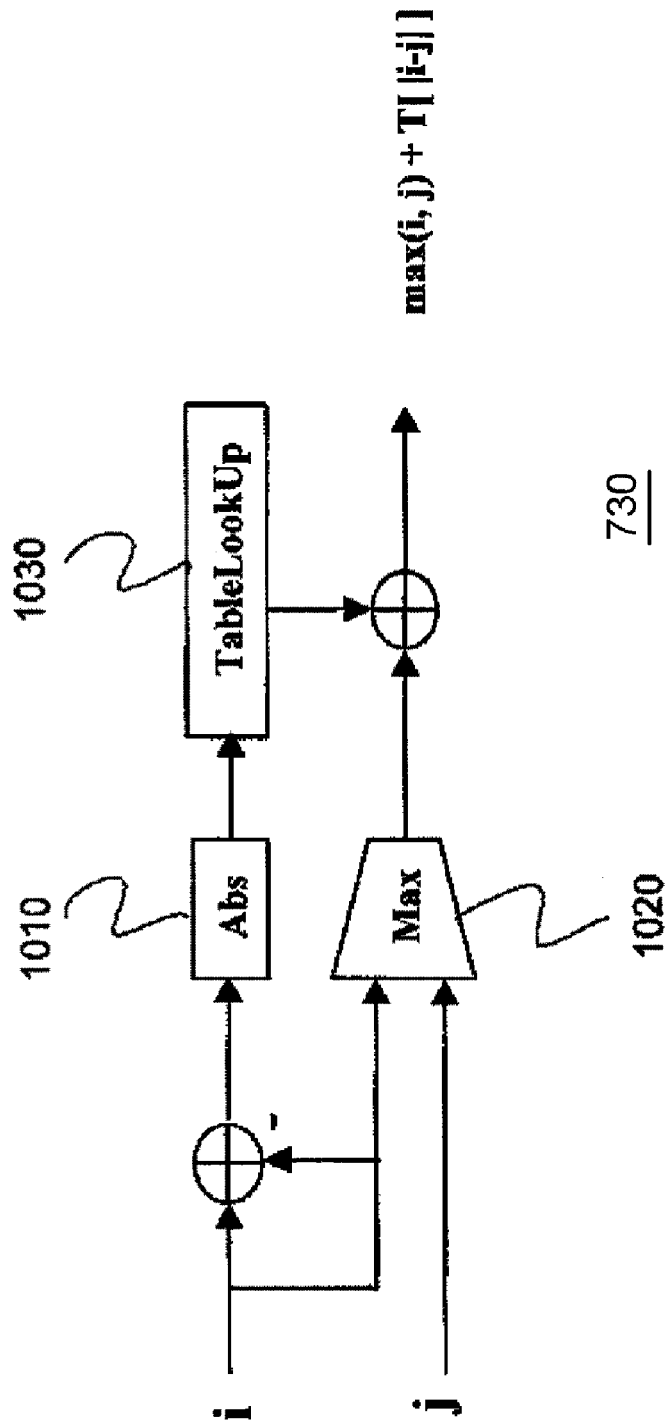
FIG. 10 illustrates an operation of a Max2 function with two inputs in accordance with one or more embodiments of the invention.
Figure 11:
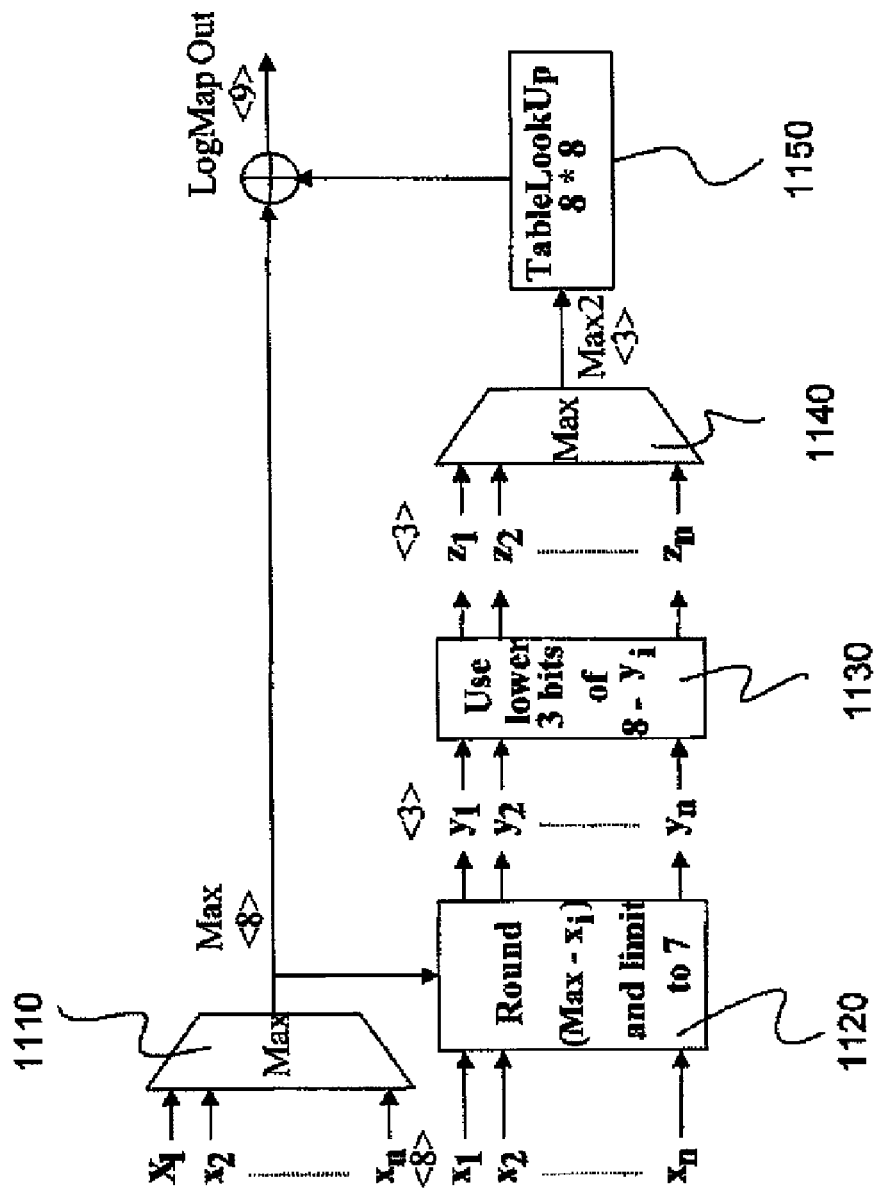
FIG. 11 illustrates an operation of a Max2 function with more than two inputs in accordance with one or more embodiments of the invention.

According to various embodiments of the invention, Max2 function block 730 implements a LogMap algorithm when two inputs are used. If more than two inputs are used, such as for Max2 function block 750 and Max2 function block 930, LogMap is approximated using two of the inputs. These implementations are illustrated in FIG. 10 and FIG. 11, respectively.

With two elements, the LogMap function is:

$$\log(e^i + e^j) = \max(i, j) + \log(1 + e^{|i-j|})$$
$$= \max(i, j) + T(|i - j|)$$

where i and j are the two inputs, and T is a look-up table. One implementation of the LogMap function with two inputs is illustrated in FIG. 10. Abs operator 1010 determines an absolute value of the difference between the two inputs. Max operator 1020 determines the maximum value of the two inputs. Look-up table 1030 provides a logarithm of its input. The output from max operator 1020 and look-up table 1030 are summed to provide the output of Max2 function block 730 for two inputs.

With more than two inputs, the LogMap function is:

$$\log(e^{x1} + \ldots + e^{xn}) \sim \log(e^{xi} + e^{xj}), \text{ where}$$
$$x_i > x_j > \ldots = \max(x_i, x_j) + T(|x_i - x_j|)$$

where i and j are the two inputs with maximum value, and T is a look-up table. One implementation of the LogMap function for more than two inputs is illustrated in FIG. 11. As illustrated, a max operator 1110 determines a maximum of the n inputs. This maximum is fed to function block 1120 which determines a first difference between the maximum and each of the n inputs, rounds the first difference for each of the n inputs, and limits them to a particular value, such as, for example, 7. These first differences are fed to a function block 1130 which determines a second difference between a second particular value, such as, for example 8, and each of the first differences, and also limits the particular value to, for example, 7. The second differences are fed to a max function block 1140 which determines the maximum of the second differences. In one embodiment of the invention, function blocks 1110, 1120, 1130, and 1140 determine the difference in value between the two largest of the n inputs. This latter difference is fed into a look-up table 1150, the output of which is added to the earlier determined maximum of the n inputs. In another embodiment of the invention, function blocks 1110, 1120, 1130 and 1140 determine the second maximum value from among the n inputs, while addressing the possibility that two or more of the inputs may correspond to the maximum value. In this embodiment, the maximum value and second maximum value are fed into look-up table 1150 as described above.

Figure 12:
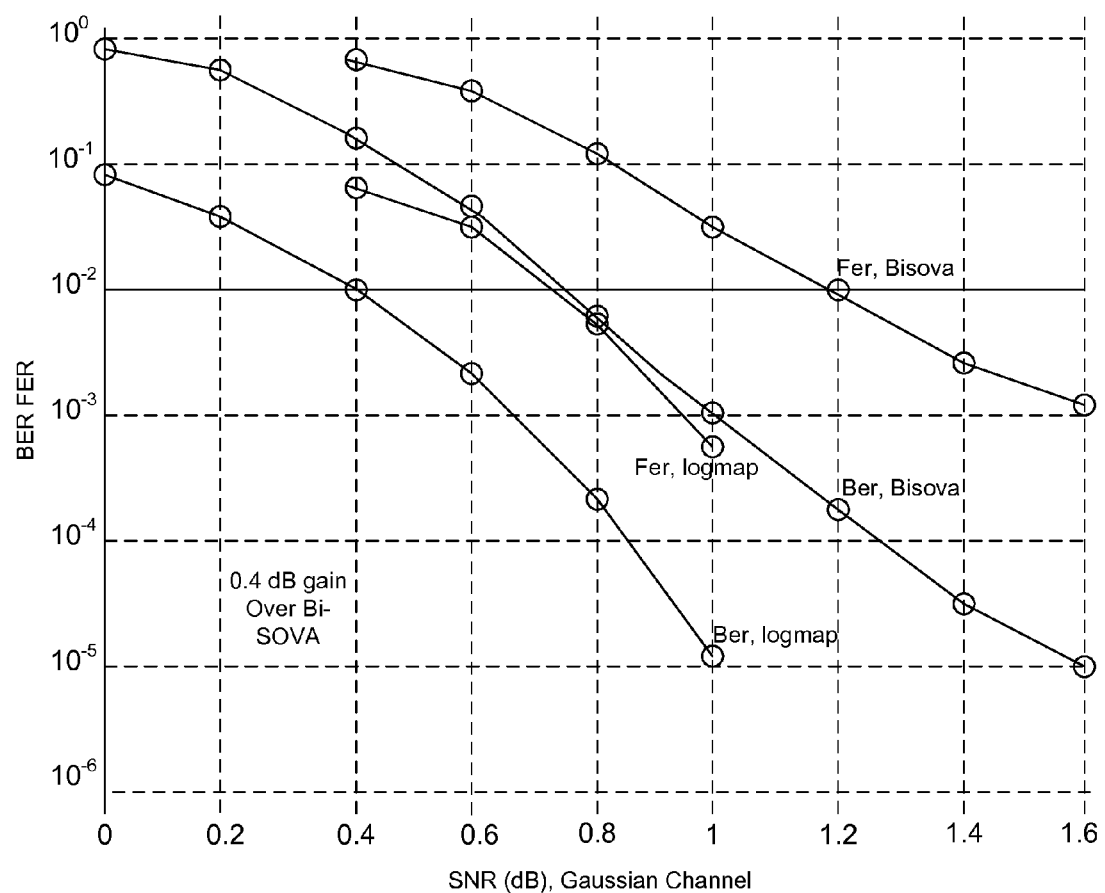
FIG. 12 illustrates a performance of a turbo decoder operating in accordance with the invention in comparison with a Viterbi sliding window scheme.

FIG. 12 illustrates the performance of one embodiment of the invention in comparison with mat of a conventional sliding window implementation. As illustrated, the invention provides a 0.1 dB improvement in performance over a conventional sliding window implementation with a reduced die size and similar level of complexity.

Figure 13:
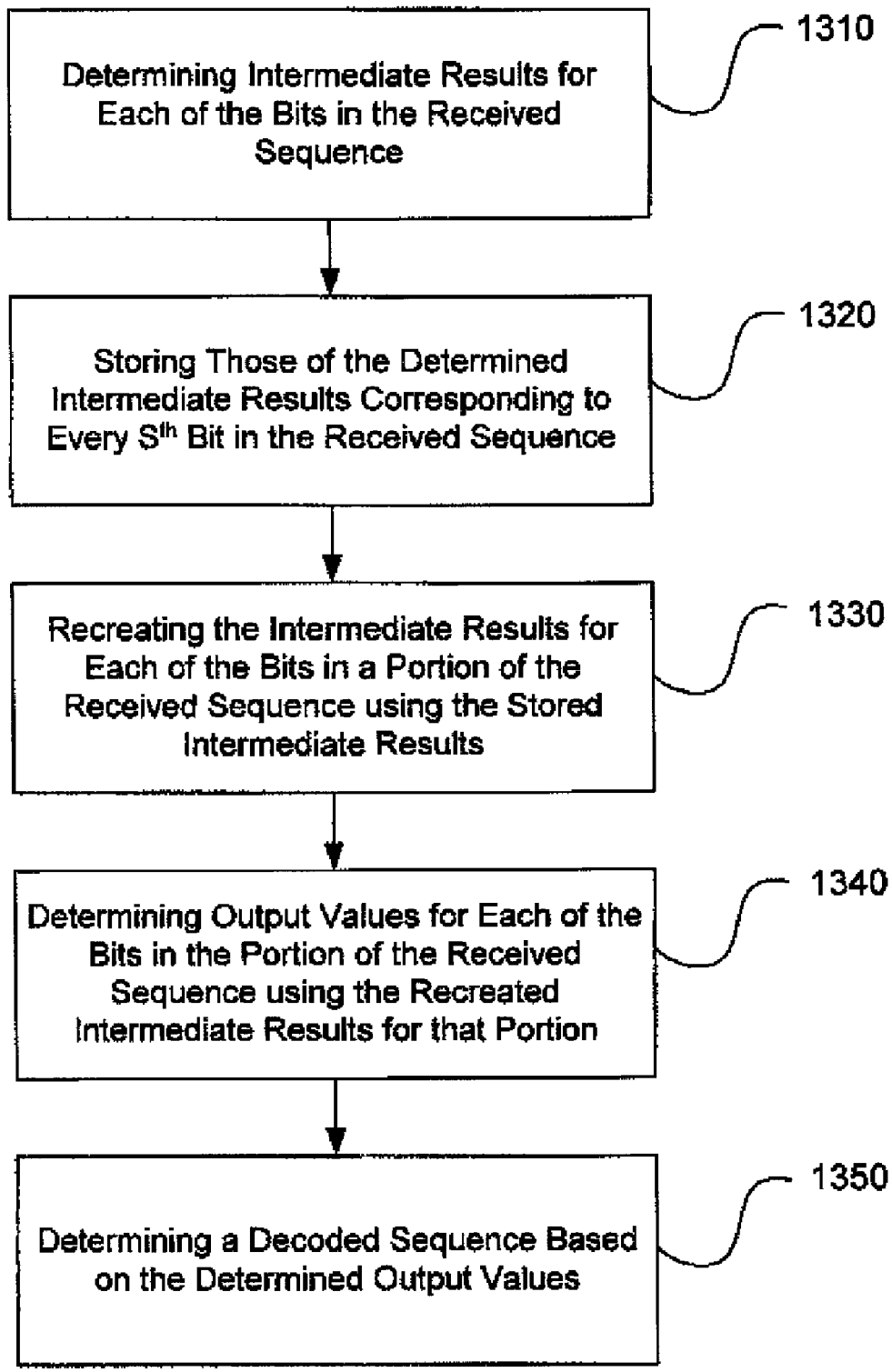
FIG. 13 is a flow chart that illustrates the operation of a turbo decoder in accordance with one or more embodiments of the invention.

FIG. 13 is a flow chart that illustrates an operation 1300 of a turbo decoder in accordance with one or more embodiments of the invention. In an operation 1310, the intermediate results for each of the bits in the received sequence is determined based on substantially the entire received sequence of bits. In an operation 1320, the intermediate results for every $S^{th}$ bit in the received sequence are stored. In some embodiments of the inventions, the appropriate results may be stored as they are determined in operation 1310.

In an operation 1330, the intermediate results are recreated for each of the bits in a portion of the received sequence using the stored intermediate results appropriate for that portion of the received sequence. In some embodiments of the invention, the portion of the received sequence for which the intermediate results are recreated is based on the size of the sliding window being used as would be appreciated.

In an operation 1340, output values are determined for each of the bits in the portion of the received sequence using the recreated intermediate results for the portion of the received sequence. In some embodiments of the invention, operations 1330 and 1340 are repeated for each portion in the received sequence as would be apparent. In an operation 1350, a decoded sequence is determined based on the determined output values.

While particular embodiments of the present invention have been described, it is to be understood that modifications will be apparent to those skilled in the art without departing from the spirit of the invention. The scope of the invention is not limited to the specific embodiments descried herein. Other embodiments, uses and advantages of the invention will be apparent to those skilled in art from consideration of the specification and practice of the invention disclosed herein. The specification should be considered exemplary only, and the scope of the invention is accordingly intended to be limited by the following claims.

What is claimed is:

1. A method for decoding a received data sequence using a LogMap function for a set of N inputs, where N is greater than 2, the method comprising:
   determining decoding results using at least one logic unit, each of the at least one logic unit performing said LogMap function by:
   determining a maximum input from among the set of N inputs;
   determining a second maximum input from among a remaining set of N−1 inputs;
   evaluating $\log(1+e^{|i-j|})$ to achieve an output, where i corresponds to one of said maximum input or said second maximum input, and j corresponds to the other one of said maximum input or said second maximum input;
   adding said output to said maximum input thereby approximating a LogMap function;
   and outputting said approximated LogMap function; and
   determining a decoded data sequence in response to said outputted approximated LogMap function and the received data sequence.

2. The method of claim 1 wherein said evaluating includes using a lookup table to determine $\log(1+e^{|i-j|})$.

3. The method of claim 1 further comprising:
   determining whether said maximum input and said second maximum input are equivalent; and
   if so, determining a third maximum input from among a second remaining set of N−2 inputs.

4. The method of claim 3 wherein said evaluating includes using said third maximum input in place of either said maximum input or said second maximum input.

5. An apparatus for decoding a received data sequence using a LogMap function for a set of N inputs, where N is greater than 2, the apparatus comprising:
   at least one logic unit implemented on a die and configured for determining decoding results, each of the at least one logic unit configured to perform said LogMap function by:
   a first maximum operator configured to determine a first maximum from among the set of N inputs;
   second maximum operator configured to determine a second maximum from among the set of N inputs, said first maximum being greater than said second maximum;

a lookup table configured to receive said first maximum and said second maximum as inputs, evaluate a function $\log(1+e^{|i-j|})$ using these inputs, and output a lookup table output, where i corresponds to one of said maximum or said second maximum, and j corresponds to the other one of said maximum or said second maximum; and an adder configured to add said first maximum and said lookup table output, thereby approximating a LogMap function; and logic configured to determine a decoded data sequence in response to said outputted approximated LogMap function and the plurality of sub-blocks of data.

6. The apparatus of claim 5 wherein said second operator includes:

a function block configured to determine a difference between said first maximum and each of the set of N inputs; and a maximum operator configured to determine a maximum of the differences determined by said function block.

7. The apparatus of claim 6 wherein said second operator is further configured to:

determine whether two inputs of the set of N inputs correspond to said first maximum value; and determine a third maximum value less than said first maximum value and greater than a remaining set of N−3 inputs.

* * * * *